(12) United States Patent
Miyamoto et al.

(10) Patent No.: US 7,005,906 B2
(45) Date of Patent: Feb. 28, 2006

(54) SEMICONDUCTOR INTEGRATED-CIRCUIT DEVICE AND METHOD TO SPEED-UP CMOS CIRCUIT

(75) Inventors: Nao Miyamoto, Yokohama (JP); Toshiyuki Sakuta, Hamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/781,746

(22) Filed: Feb. 20, 2004

(65) Prior Publication Data

US 2004/0223401 A1    Nov. 11, 2004

(30) Foreign Application Priority Data

Mar. 28, 2003 (JP) .............................. 2003-090212
Jun. 17, 2003 (JP) .............................. 2003-172486
Feb. 5, 2004 (JP) .............................. 2004-029033

(51) Int. Cl.
*G06F 1/04* (2006.01)
*G06F 9/45* (2006.01)

(52) U.S. Cl. ........................... 327/293; 327/144; 716/6

(58) Field of Classification Search ................ 326/107, 326/117, 120, 93, 72, 108, 121, 81; 716/17, 716/6, 2; 327/201–203, 208–218
See application file for complete search history.

(56) References Cited

U.S. PATENT DOCUMENTS

| | | | |
|---|---|---|---|
| 6,222,410 B1 * | 4/2001 | Seno | 327/293 |
| 6,380,764 B1 | 4/2002 | Katoh et al. | 326/93 |
| 6,577,153 B1 * | 6/2003 | Kodama | 326/27 |
| 6,769,110 B1 * | 7/2004 | Katoh et al. | 716/17 |
| 2002/0027256 A1 | 3/2002 | Ishibashi et al. | 257/391 |

FOREIGN PATENT DOCUMENTS

| | | |
|---|---|---|
| JP | 11-195976 | 7/1999 |
| JP | 2001-15704 | 1/2001 |

* cited by examiner

*Primary Examiner*—Vibol Tan
(74) *Attorney, Agent, or Firm*—Antonelli, Terry, Stout and Kraus, LLP.

(57) ABSTRACT

The present invention provides a semiconductor integrated-circuit device capable of achieving higher-density integration and faster operation, and a CMOS circuit operational speeding-up method for easily achieving the operating speeds of CMOS circuits, including existing one.

A signal transferring path includes a plurality of CMOS-constructed logic gate circuits provided between one pair of flip-flop circuits for acquiring and holding signals by use of clock signals. The signal transferring path includes a first and a second signal transferring path. The first signal transferring path is constituted by enhancement-type MOSFETs and has a signal transferring delay time equal to, or less than, a permissible signal transferring delay time. The second signal transferring path is configured such that, among the above-mentioned plurality of logic gate circuits, a logic gate circuit having a delay time longer than the above-mentioned permissible signal transferring delay time when constituted using enhancement-type MOSFETs is replaced with a depletion-type MOSFET so that the second signal transferring path may provide a signal transferring delay time equal to or less than the permissible signal transferring delay time mentioned above.

16 Claims, 16 Drawing Sheets

SEMICONDUCTOR INTEGRATED-CIRCUIT DEVICE AND METHOD TO SPEED-UP CMOS CIRCUIT

CROSS REFERENCE TO RELATED APPLICATION

The present application claims priority from Japanese applications JP2003-090212 filed on Mar. 28, 2003, JP2003-172486 filed on Jun. 17, 2003, and JP2004-029033 filed on Feb. 5, 2004 the contents of which are hereby incorporated by reference into this application.

BACKGROUND OF THE INVENTION

The present invention relates to a semiconductor integrated-circuit device and a method for speeding up CMOS circuit operation, and more particularly to a technology advantageously used for speeding up the operation of semiconductor integrated-circuit devices comprising CMOS circuits.

In Japanese Patent Laid-open No. 11-195976, the present applicant has already proposed a MOSFET-constructed semiconductor integrated-circuit device in which there is attained a preferred harmony between operating speed and increases in power consumption due to leakage currents. According to the above-mentioned publication, among the plurality of signal paths in the semiconductor integrated-circuit device, a signal path having a margin for delay with which a signal is transferred along the signal path is constituted by MOSFETs with high threshold voltage. Conversely, a path not having a margin for delay is constituted by low-threshold-voltage MOSFETs which, although large in sub-threshold leakage current, operate at high speed. Means for achieving a high threshold voltage and a low threshold voltage in the MOSFETs as mentioned above can be obtained by changing the density of the impurities under the gate oxide film of the semiconductor substrate, by changing the thickness of the gate oxide film, by changing the substrate bias voltage applied to a well region, by changing the gate length, and by combining these methods. Also, a semiconductor integrated-circuit device that uses high-withstand-voltage MOSFETs and high-threshold-voltage MOSFETs in its input/output circuits is described in Japanese Patent Laid-open No. 2001-015704.

SUMMARY OF THE INVENTION

The description in the above-mentioned publications is based only on the recognition that a harmony between operating speed and minimum power consumption is attained by utilizing the characteristics and features of CMOS circuits. Accordingly, speeding-up has its limits, and to achieve further speeding-up, bipolar transistors need to be used. Using bipolar transistors to construct a circuit, however, poses major problems in terms of power consumption and integration density.

An object of the present invention is to provide semiconductor integrated-circuit devices capable of achieving both higher-density circuit integration and faster operation. Another object of the present invention is to provide a CMOS circuit operational speeding-up method by which the operating speeds of CMOS circuits, including existing ones, can be easily increased. The above objects, other objects, and new features of the present invention will be more fully understood from the description of this specification when reference is made to the accompanying drawings.

Among all aspects of the invention disclosed in the present application, a typical one is briefly described below. That is to say, a signal transferring path includes a plurality of CMOS-constructed logic gate circuits provided between one pair of flip-flop circuits for acquiring and holding signals by use of clock signals. The signal transferring path includes a first and a second signal transferring path. The first signal transferring path is constituted by enhancement-type MOSFETs and has a signal transferring delay time equal to, or less than, a permissible signal transferring delay time. The second signal transferring path is configured such that, among the above-mentioned plurality of logic gate circuits, a logic gate circuit having a delay time longer than the above-mentioned permissible signal transferring delay time when constituted using enhancement-type MOSFETs is replaced with a depletion-type MOSFET so that the second signal transferring path may provide a signal transferring delay time equal to or less than the permissible signal transferring delay time mentioned above.

Among all aspects of the invention disclosed in the present Application, another typical one is briefly described below. That is to say, a designing step is repeated so that the signal transferring delay time of all the signal transferring paths may stay within a permissible signal transferring delay time range. The designing step includes: designing a signal-processing circuit using enhancement type MOSFETs, the signal-processing circuit comprising a plurality of flip-flop circuits for acquiring and holding signals by use of clock signals, and a plurality of CMOS-constructed logic gate circuits provided between one pair of flip-flop circuits within the plurality of flip-flop circuits; extracting, from the plurality of signal transferring paths, a signal transferring path whose signal transferring delay time that exceeds a permissible signal transferring delay time; and replacing, among the plurality of logic gate circuits constituting the signal transferring path that has extracted, a logic gate circuit having a delay time longer than the permissible signal transferring delay time when the logic gate circuit is constituted by an enhancement-type MOSFET with a depletion-type MOSFET so that the signal transferring path may provide a signal transferring delay time equal to or less than the permissible signal transferring delay time.

DETAILED DESCRIPTION OF THE PREFERRED EMBODIMENTS

Figure 1:
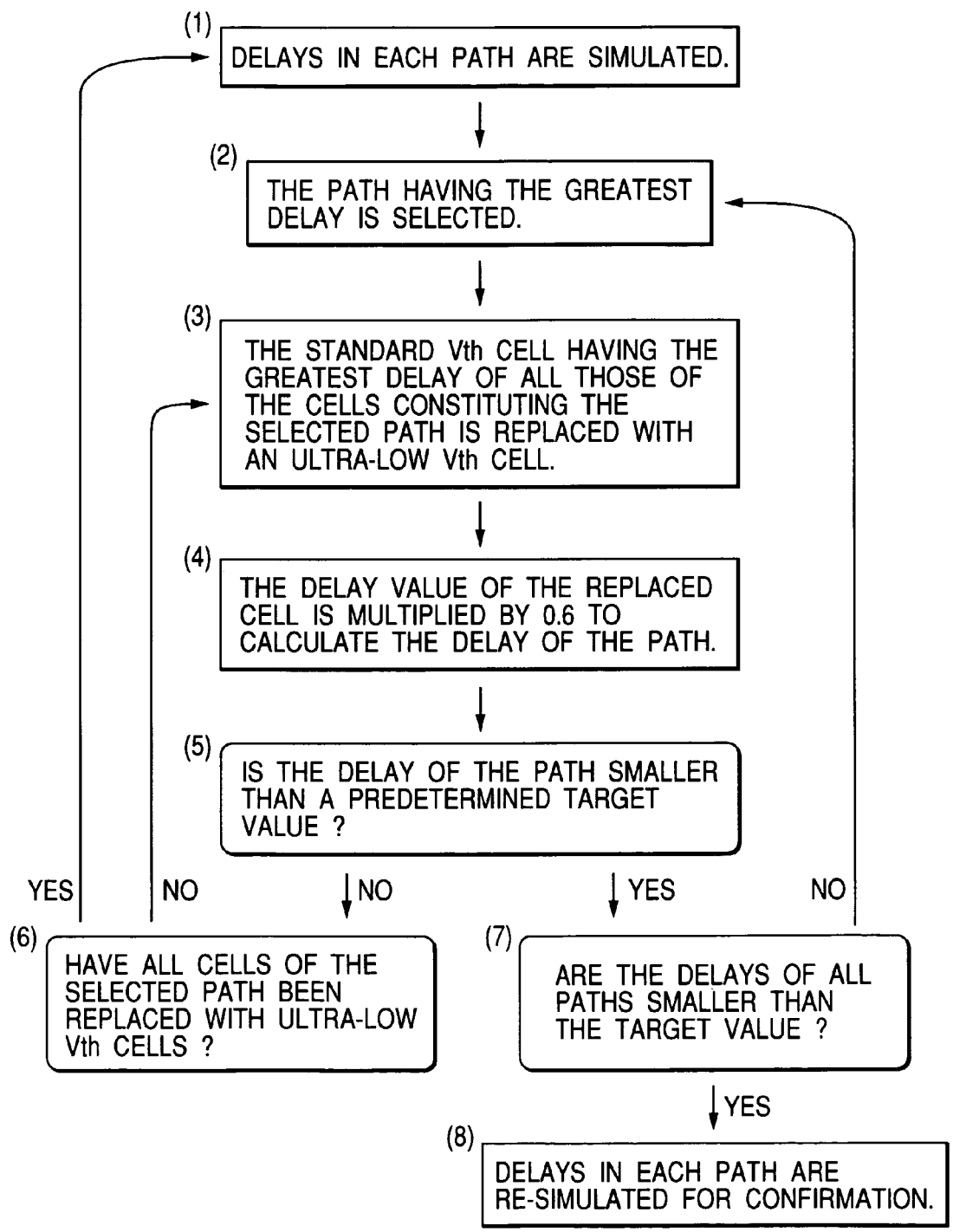
FIG. 1 is a flowchart illustrating a CMOS circuit designing method according to an embodiment of the present invention.
Figure 2:
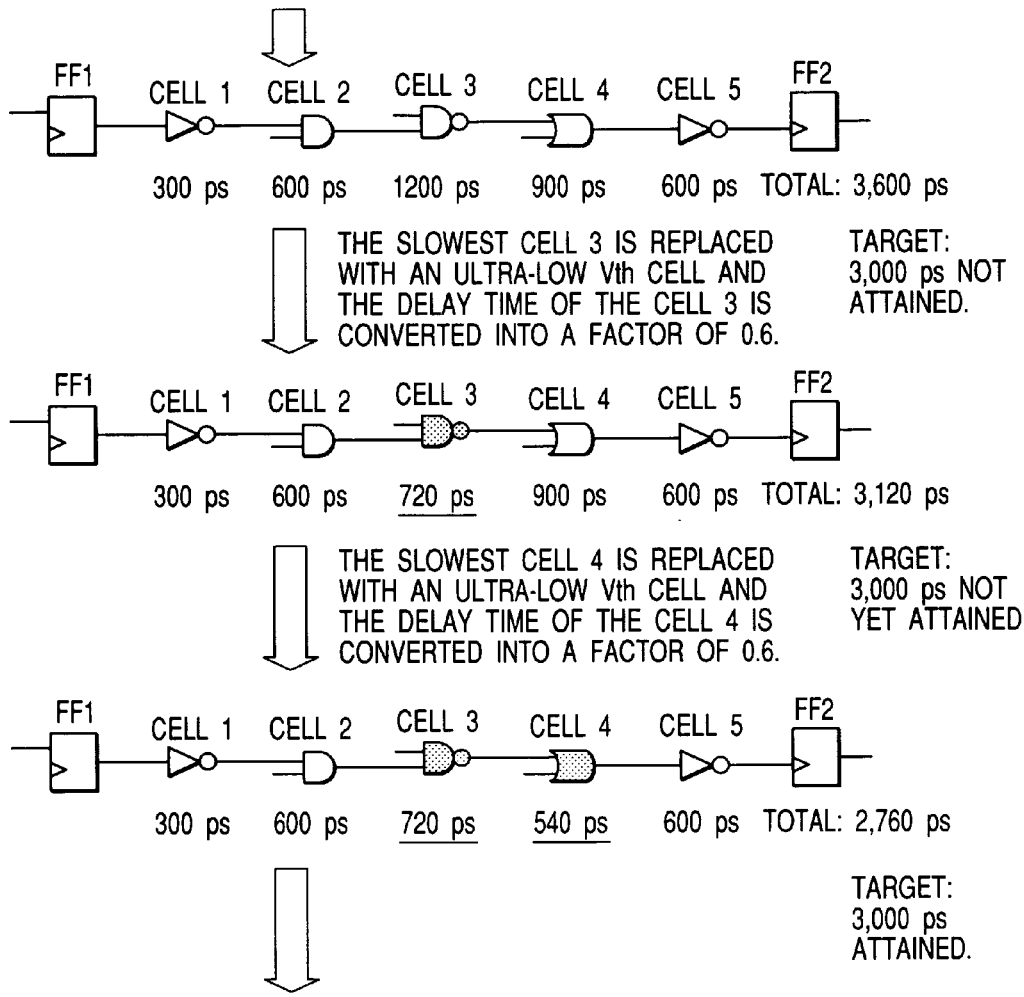
FIG. 2 is a conceptual diagram of a digital logic circuit corresponding to the designing method of FIG. 1.

FIG. 1 is a flowchart showing an embodiment of a CMOS circuit designing method according to the present invention. FIG. 2 is a conceptual circuit diagram corresponding to the designing method. The CMOS circuits in this example are directed for use as the internal logic circuits constructed in a semiconductor integrated-circuit device to provide signal processing, and therefore, the application of these CMOS circuits is not specifically limited. These circuits are constituted by a combination of MOSFETs having three types of threshold voltages: a high threshold voltage (hereinafter, referred to as standard Vth), a low threshold voltage (likewise, low Vth), and an ultra-low threshold voltage (likewise, ultra-low Vth). Metal-oxide semiconductors (MOS's) with different threshold values can be created by, for example, changing the dose rate of ion implantation or changing the substrate bias by use of the method described later.

In step (1) of FIG. 1, all signal-processing circuits for providing desired digital signal processing are constituted and designed using standard-Vth MOSFETs, and delays in each path are simulated.

In step (2) of FIG. 1, the path that is the greatest of all paths in terms of delay is selected. More specifically, as shown in FIG. 2, the signal transferring time in the signal transferring paths (alias referred to as signal propagation paths or simply as paths) that are constructed of two flip-flop circuits such as a flip-flop circuit FF1 and a flip-flop circuit FF2, and of cells 1 to 5 constituting a logic gate circuit provided between the flip-flop circuits, is calculated by timing analysis simulation using a high-speed computer, and the path having the greatest delay value is selected.

In step (3) of FIG. 1, among the cells constituting the above-selected path, the standard-Vth cell having the greatest delay is extracted and then replaced with an ultra-low-Vth cell. More specifically, as shown in FIG. 2, a cell 3 that is the slowest cell is extracted and then replaced with an ultra-low-Vth cell.

In step (4) of FIG. 1, the delay value of the above-replaced cell is multiplied by 0.6 and the delay of the path is calculated. More specifically, as shown in FIG. 2, the delay of the cell 3 provided with hatching to indicate that the cell has been replaced with an ultra-low-Vth cell is reduced to 0.6 times the delay time of 1200 ps existing before the replacement, and 720 ps is calculated as the delay value detected there.

In step (5) of FIG. 1, the above-calculated delay value is judged whether it is smaller than a target value. More specifically, as shown in FIG. 2, a total delay time of 3,120 ps is calculated taking, as 720 ps, the delay value of the cell 3 which was replaced with an ultra-low-Vth cell, and the actual total value consequently obtained is judged whether it is equal to or smaller than a target value of 3,000 ps.

In step (6) of FIG. 1, if, as described above, the calculated total delay time is 3120 ps and its actual value obtained as a result of the calculation is equal to or smaller than the target value of 3000 ps, all cells of the selected path are judged whether they have been replaced with ultra-low-Vth cells. Consequently, if, as shown in FIG. 2, there exist cells 1, 2, 4, and 5 that have not yet been replaced with ultra-low-Vth cells, as in the case where only the cell 3 was replaced with an ultra-low-Vth cell, processing returns to step (3). If all cells have been replaced with ultra-low-Vth cells, since it is impossible to implement further speeding-up in the corresponding path, processing returns to step (1). After all cells have been replaced with ultra-low-Vth cells, in order to attain the target delay, the circuit may be reconstructed so that the path as mentioned above cannot be created from the phase of logic synthesis, or the target delay may be replaced as a delay of the path existing after all cells have been replaced with ultra-low-Vth cells.

In step (3) of FIG. 1, similarly to the above, the standard-Vth cell having the greatest delay is extracted from the cells 1, 2, 4, and 5 that do not yet become ultra-low-Vth cells, and that cell is then replaced with an ultra-low-Vth cell. More specifically, in the example of FIG. 2, the slowest cell 4 is extracted, which is then replaced with an ultra-low-Vth cell.

In step (4) of FIG. 1, the delay value of the above-replaced cell is multiplied by 0.6 and the delay of the path is calculated. More specifically, as shown in FIG. 2, the delay time of 900 ps of the cell 3 existing before it was replaced with an ultra-low-Vth cell is multiplied by 0.6 and the delay time of the cell 3 which was replaced with an ultra-low-Vth cell is calculated as 540 ps.

In step (5) of FIG. 1, the above-calculated delay value is judged whether it is smaller than the target value. More specifically, as shown in FIG. 2, the delay value of the cell 4 which was replaced with an ultra-low-Vth cell is also modified to 540 ps, then the total delay time of 2760 ps in the corresponding path is calculated, and its actual total delay time consequently obtained is judged whether is equal to or smaller than the target value of 3000 ps.

In step (5) mentioned above, if the delay of the above single path is judged to be equal to,.or smaller than, the target value, all the remaining paths are also judged in step (7) whether they are equal to or smaller than the target value. If there still exist any paths whose delays are greater than the target value, processing returns to step (2) and the same steps are repeated.

In step (7), if the delays of all paths are judged to be equal to or smaller than the target value, the delays in each path are re-simulated in step (8) for confirmation.

As shown in FIG. 2, paths greater than the target value in terms of delay time may be extracted by simulation, during which the step (1) and subsequent ones of FIG. 1 may then be performed. Alternatively in step (6), if the delay time is not reduced to or below the target value even by replacement of all cells of the selected path with ultra-low-Vth cells, since the circuit will not operate properly, the delay time in the selected path may be replaced with a new target value and then a circuit operating at the maximum speed of the MOS circuit may be designed.

In step (1), the signal-processing circuits that conduct desired digital signal processing do not need to be newly designed ones and can be existing CMOS circuits. For example, in the case of a currently operating circuit or of, as with a microprocessor that has already been developed as an old-generation one, a macro-structured CMOS circuit, if the operating speed of the circuit is too slow and the design and development of a new circuit are required only for this reason, circuit operation can be easily speeded up by using the design data intact and applying a CMOS circuit operational speeding-up method pertaining to the present invention. With such a CMOS circuit operational speeding-up method, circuit operation can be speeded up without special circuit debugging being required, since the circuit function itself for providing digital signal processing, such as the function itself of a microprocessor circuit, has already been proved to operate properly at low speed.

Figure 3:
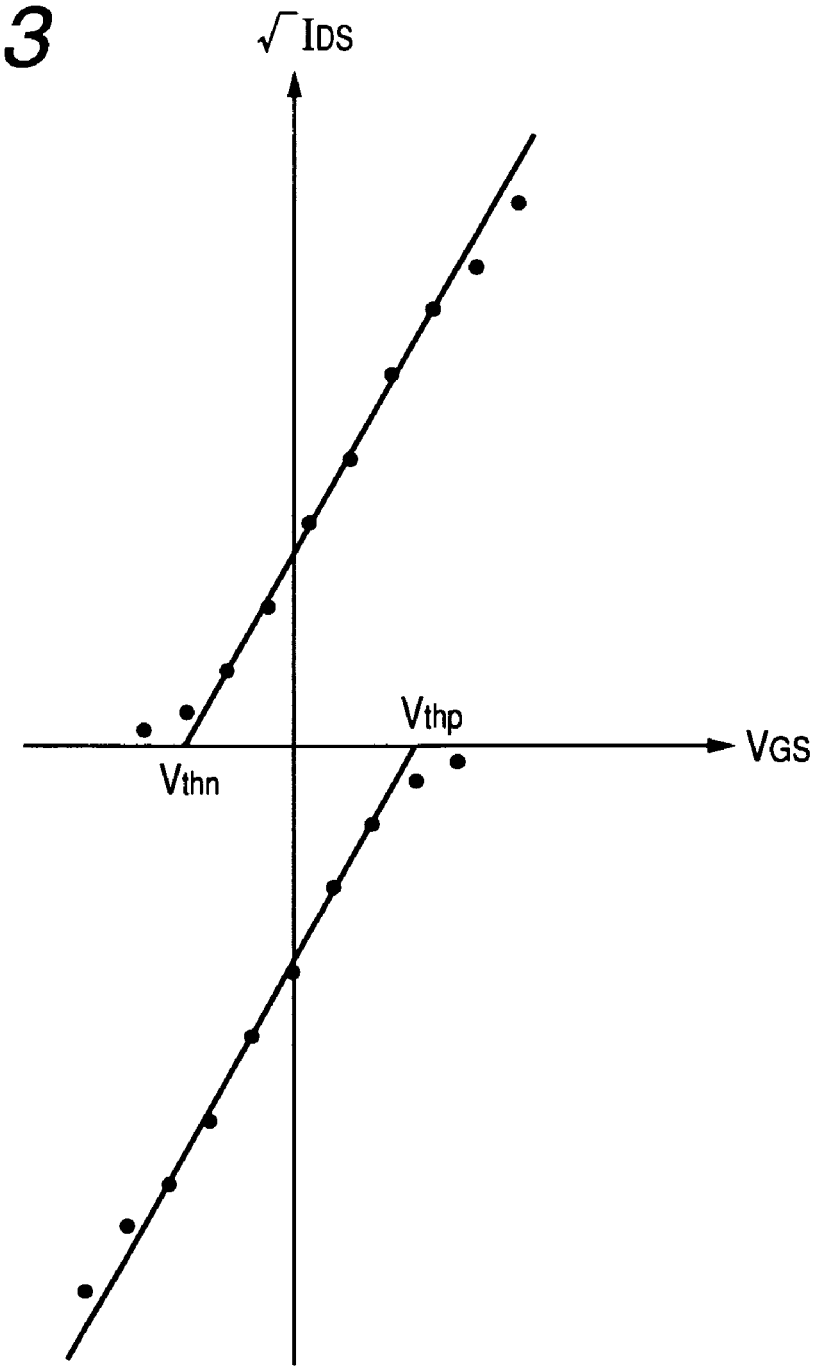
FIG. 3 is a current-voltage characteristics curve of an ultra-low-Vth N-type MOSFET used in the present invention.

Here, the MOSFETs that are ultra-low-Vth cells are constructed of depletion-type MOSFETs. The MOSFETs generally called "depletion-type MOSFETs", for example, N-channel MOSFETs refer to MOSFETs having a negative threshold voltage Vthn, and P-channel MOSFETs refer to MOSFETs having a positive threshold voltage Vthp. As shown in FIG. 3, the threshold voltage Vthn of an N-channel MOSFET is determined by the extrapolated point of Vgs at which, when the MOSFET is operated in a saturation region and the relationship between $\sqrt{Ids}$ and Vgs is plotted, $\sqrt{Ids}$ becomes equal to zero. In depletion-type N-channel MOSFETs, the extrapolated point of Vgs is negative. Realistically, since a sub-threshold current exists, this type of MOSFET can be said to be such that when gate-to-source voltage Vgs is zero, drain-to-source current Ids is flowing, and such that when a negative gate-to-source voltage Vgs exceeding a certain value is applied, the drain-to-source current Ids becomes zero. Similarly, the threshold voltage Vthp of a P-channel MOSFET is determined by the extrapolated point of Vgs at which, when the MOSFET is operated in a saturation region and the relationship between $\sqrt{Ids}$ and Vgs is plotted, $\sqrt{Ids}$ becomes equal to zero. In depletion-type P-channel MOSFETs, the extrapolated point of Vgs is positive. Realistically, since a sub-threshold current exists, it can also happen that when gate-to-source voltage Vgs is zero, drain-to-source current Ids is flowing, and that when a negative gate-to-source voltage Vgs exceeding a certain value is applied, the drain-to-source current Ids becomes zero.

In general, a greater leakage current occurs in MOSFETs lower in Vth value, and the respective leakage currents of ultra-low-Vth and low-Vth MOSFETs per unit gate width are, respectively, about 100 times and 10 times the leakage currents of standard-Vth MOSFETs. Accordingly, if a multitude of low-Vth MOSFETs are used, their leakage currents exceed a permissible value. Also, if the leakage current value of the entire chip is suppressed to a certain permissible value, the number of MOSFETs which can be used decreases as the Vth value becomes smaller. Conversely, however, the rate of contribution to speeding-up is increased since the drain current increases with decreases in Vth value.

In step (3) of FIG. 1, before standard-Vth cells being replaced with ultra-low-Vth cells as described earlier, each standard-Vth cell may be replaced with a low-Vth cell in order of the magnitude of the delay time, and then, even after all cells in one path have been changed from standard-Vth ones to low-Vth ones, the target value may be not attained in step (6). In this case, the above low-Vth cells may be further replaced with ultra-low-Vth cells in order of the magnitude of the delay time, in step (3). In this configuration, the use of ultra-low-Vth cells great in leakage current can be quantitatively reduced and this, in turn, makes it possible to reduce power consumption. In other words, since the increment in leakage current becomes the same between simply using one ultra-low-Vth cell and using 10 low-Vth cells, if it is possible to add, for example, five more to the above low-Vth cells and hereby to reduce the number of ultra-low-Vth cells by one, increases in leakage current, associated with speeding-up, can be reduced to half.

The delay time of the cells that are changed from the above-mentioned standard-Vth cells to ultra-low-Vth cells is reduced to 0.6 times the delay time of the standard-Vth cells. This value is selected from the relative relationship between the standard-Vth cells and ultra-low-Vth cells that are set as described above. This relationship can therefore be modified by varying the respective threshold voltages of the ultra-low-Vth cells and the standard-Vth cells. Also, at such threshold voltages as shown in the above example, if the standard-Vth cells are replaced with low-Vth cells, the delay time may be reduced to about 0.8 times that of the standard-Vth cells.

Figure 4:
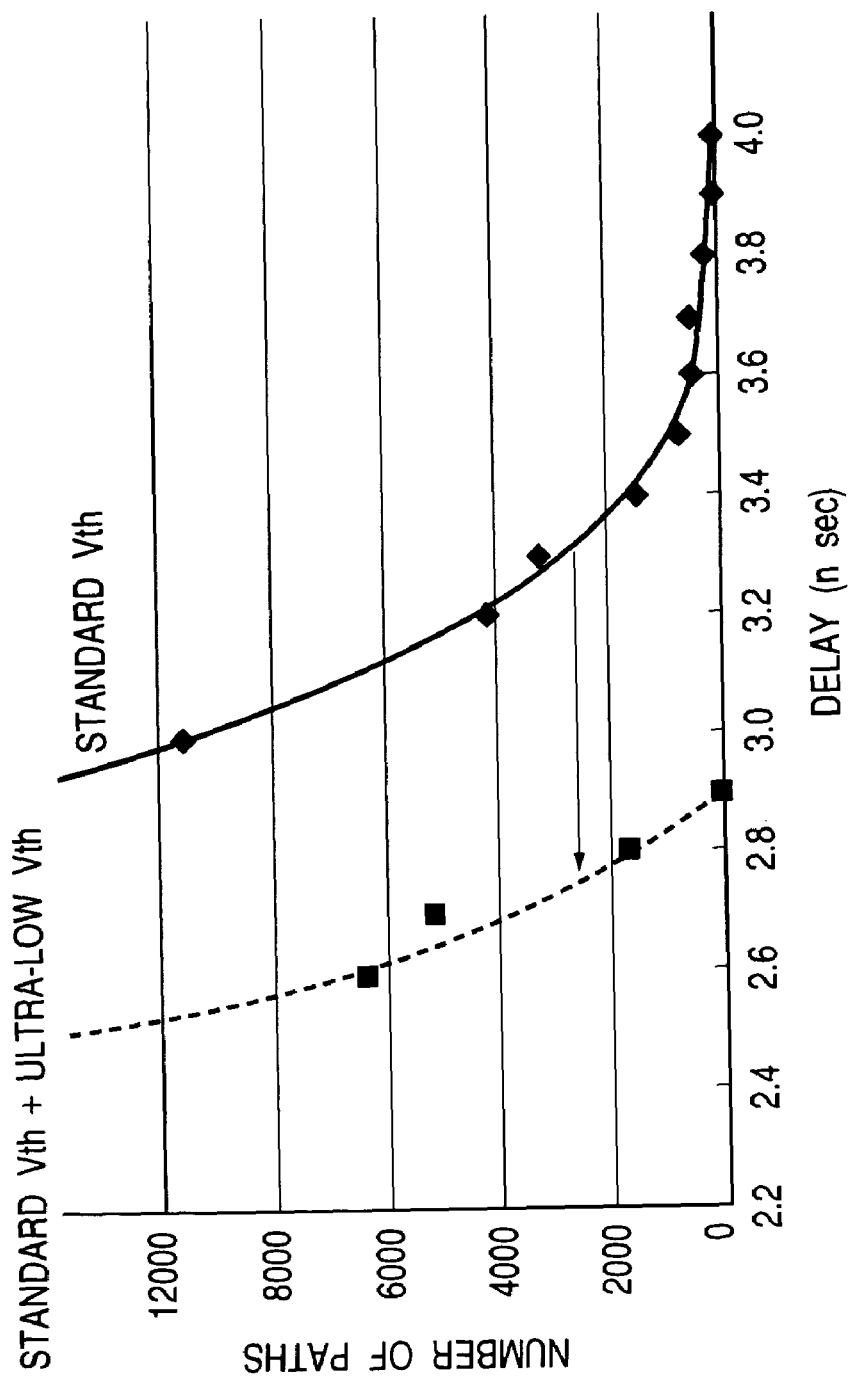
FIG. 4 is a typical distribution diagram for explaining the relationship between the number of paths and delay time in a digital logic circuit block to which the present invention is applied.

FIG. 4 is a distribution chart exemplifying the relationship between the number of paths and delay time in a digital logic circuit block. The delay time in each path can be controlled to or below a target value of 3 nsec by, for example, adding an ultra-low-Vth gate circuit to part or all of a set of paths constituted by standard-Vth MOSFETs and exceeding the target value of 3 nsec.

Table 1 shown below indicates the relationships between the respective operating frequencies and standby currents existing when MOSFETs including only standard-Vth cells, MOSFETs including only low-Vth cells, MOSFETs including only ultra-low-Vth cells, MOSFETs including standard-Vth cells and low-Vth cells (30%), and MOSFETs including standard-Vth cells and ultra-low-Vth cells (2%) are mounted in specific independent digital logic circuits studied by the present inventor. As shown in Table 1, even if the standard-Vth MOSFETs are replaced with low-Vth ones, the operating frequency ratio can only be increased to 1.25 and cannot be improved too significantly. Also, although replacement of all standard-Vth MOSFETs with ultra-low-Vth ones greatly increases the operating frequency ratio to 1.75, the leakage current ratio increases to as excessively high as 220, and therefore, this method is not realistic.

TABLE 1

|  | Operating frequency ratio with the operating frequency of a standard-Vth-only MOSFET circuit taken as 1 | Leakage current ratio with the leakage current value of a standard-Vth-only MOSFET circuit taken as 1 |
| --- | --- | --- |
| Standard Vth only | 1 | 1 |
| Low Vth only | 1.25 | 11.66 |
| Ultra-low Vth only | 1.75 | 220.00 |
| Standard Vth + Low Vth (30%) | 1.25 | 4.20 |
| Standard Vth + Ultra-low Vth (2%) | 1.7 | 5.56 |

Therefore, when standard-Vth MOSFETs and low-Vth MOSFETs are combined, although the leakage current ratio can be improved to a certain extent over that of low-Vth-only MOSFETs, the operating frequency ratio that is the more important of the two factors can only be improved to almost the same extent as that of low-Vth-only MOSFETs. However, combination of standard-Vth MOSFETs and ultra-low-Vth MOSFETs makes it possible not only for the operating frequency ratio to be improved to a level almost comparable to that of ultra-low-Vth-only MOSFETs, but also for the leakage current ratio to be decreased to a level slightly higher than in the case of the above-mentioned combination of standard-Vth MOSFETs and ultra-low-Vth MOSFETs. Increases in the leakage current ratio can be reduced by changing the substrate bias described later.

Figure 5:
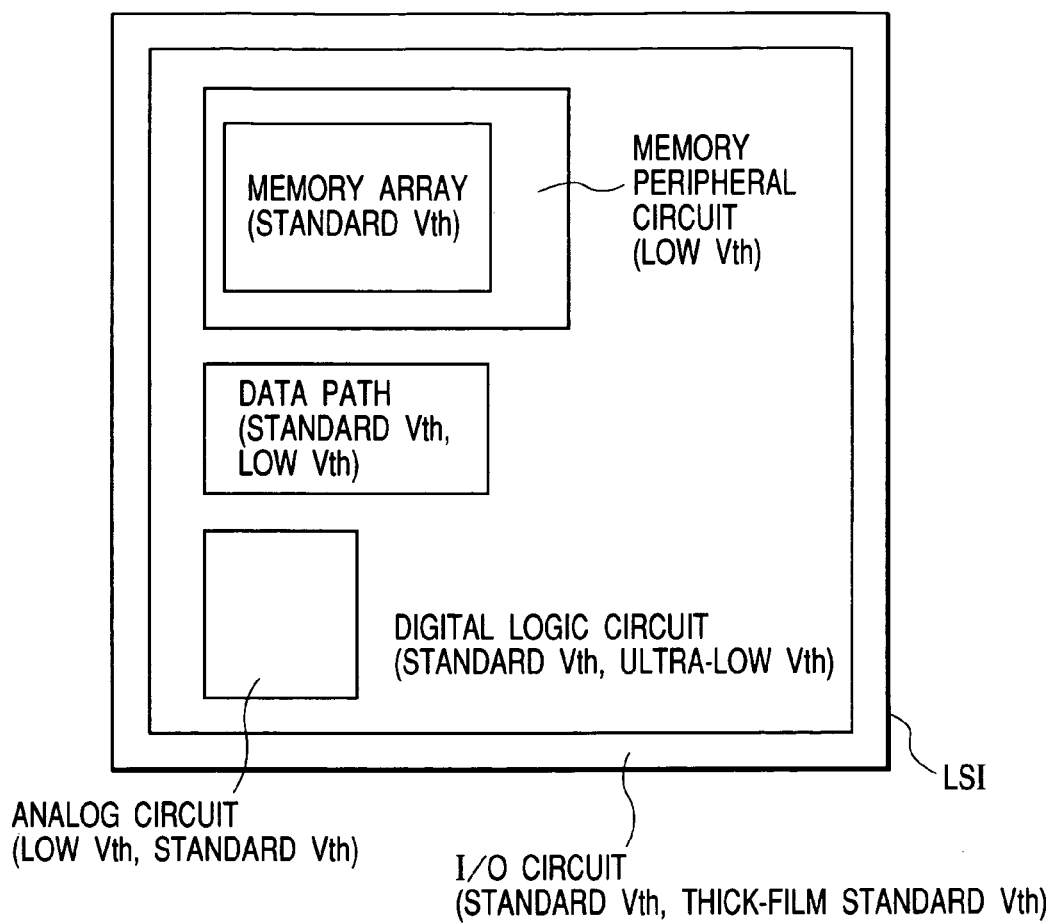
FIG. 5 is a schematic block diagram showing an embodiment of a semiconductor integrated-circuit device to which the present invention was applied.

A schematic block diagram of an embodiment of a semiconductor integrated-circuit device to which the present invention is applied is shown in FIG. 5. In this figure, each circuit block is shown in line with the general geometric layout on the semiconductor chip that constitutes the semiconductor integrated-circuit device LSI. In this embodiment, a memory block, a data path block, an analog circuit block, and a digital logic circuit block are internally formed and an input/output (I/O) circuit block is disposed around the chip.

In this embodiment, the semiconductor integrated-circuit device, although not limited specifically, is constructed of five types of MOSFETs different in threshold voltage Vth. In addition to the ultra-low-Vth, standard-Vth and low-Vth MOSFETs used for the digital logic circuit block, there are provided two types: low-Vth I/O cells and standard-Vth I/O cells. The low-Vth I/O cells and the standard-Vth I/O cells are used as high-withstand-voltage MOSFETs since they have a thick gate-insulation film so that a high voltage can be applied to the gate.

Figure 6:
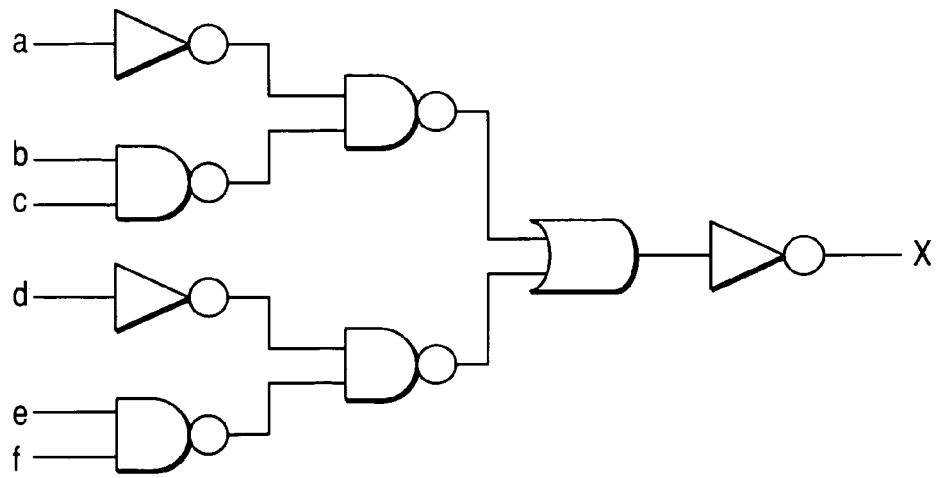
FIG. 6 is a circuit diagram showing an embodiment of a digital logic circuit block pertaining to FIG. 5.

FIG. 6 is a circuit diagram of a digital logic circuit according to an embodiment. The digital logic circuit in this embodiment has one output signal "x" formed for input signals "a", "b", "c", "d", "e", and "f". AS logic stages, the input signals "a", "b", "c", "d", "e", and "f" are passed through the four-stage logic circuit constructed of inverter circuits and gate circuits, and thereby, the output signal "x" is formed. Each of the input signals "a", "b", "c", "d", "e", and "f" is, as in FIG. 6, output in synchronization with a clock signal by a flip-flop circuit, and the above-mentioned output signal "x" is acquired into the flip-flop circuit in synchronization with a clock signal.

The digital logic circuit in this embodiment is shown with focus being placed on the output signal "x". Therefore, although the number of fan-outs in each gate circuit is one, the output signals of each logic stage, including the above-mentioned input signals "a", "b", "c", "d", "e", and "f", may actually be output to other logic gate circuits not shown in the figure. The inverter circuits and the logic gate circuits, both large in the number of fan-outs, increase in load capacity, thus prolonging the signal transferring delay time in these circuits. These gate circuits with a prolonged signal transferring delay time are changed from standard-Vth cells to ultra-low-Vth cells as described earlier, and hereby, the signal transferring delay time to the acquisition of the output signal "x" is controlled to or below a target value.

In this way, the digital logic circuit is constituted by the above-mentioned combination of standard-Vth cells and ultra-low-Vth cells. That is to say, basically, this circuit is constituted by combining, as described earlier, enhancement-type MOSFETs having standard-Vth cells with depletion-type MOSFETs having ultra-low-Vth cells. The above-mentioned enhancement-type MOSFETs, however, may also be able to include low-Vth cells, provided that the target delay value of the path can be attained by combining standard-Vth MOSFETs with low-Vth MOSFETs.

As described above, ultra-low-Vth MOSFETs (depletion-type) and standard-Vth MOSFETs are used in the digital logic circuit block. These two types of MOSFETs are effectively used for each logic cell. Since the leakage current in a MOSFET exponentially increases with respect to its Vth value, a large leakage current occurs in a MOSFET whose Vth value is reduced to provide the depletion type. Accordingly, using depletion-type MOSFETs may undesirably increase a standby current or create a thermally uncontrollable state, and therefore, ultra-low-Vth MOSFETs of the depletion type have not been used in conventional CMOS circuits. However, since the cells that use ultra-low-Vth MOSFETs can be speeded up more significantly than in the case of standard-Vth or low-Vth MOSFETs, the speeds of critical paths can be sufficiently increased. For this reason, leakage currents can be minimized for faster operation by limiting the application of depletion-type ultra-low-Vth MOSFETs only to critical paths. Accordingly, the digital logic circuit block can use ultra-low-Vth and standard-Vth MOSFETs to speed up circuit operation and to minimize leakage currents.

Figure 7:
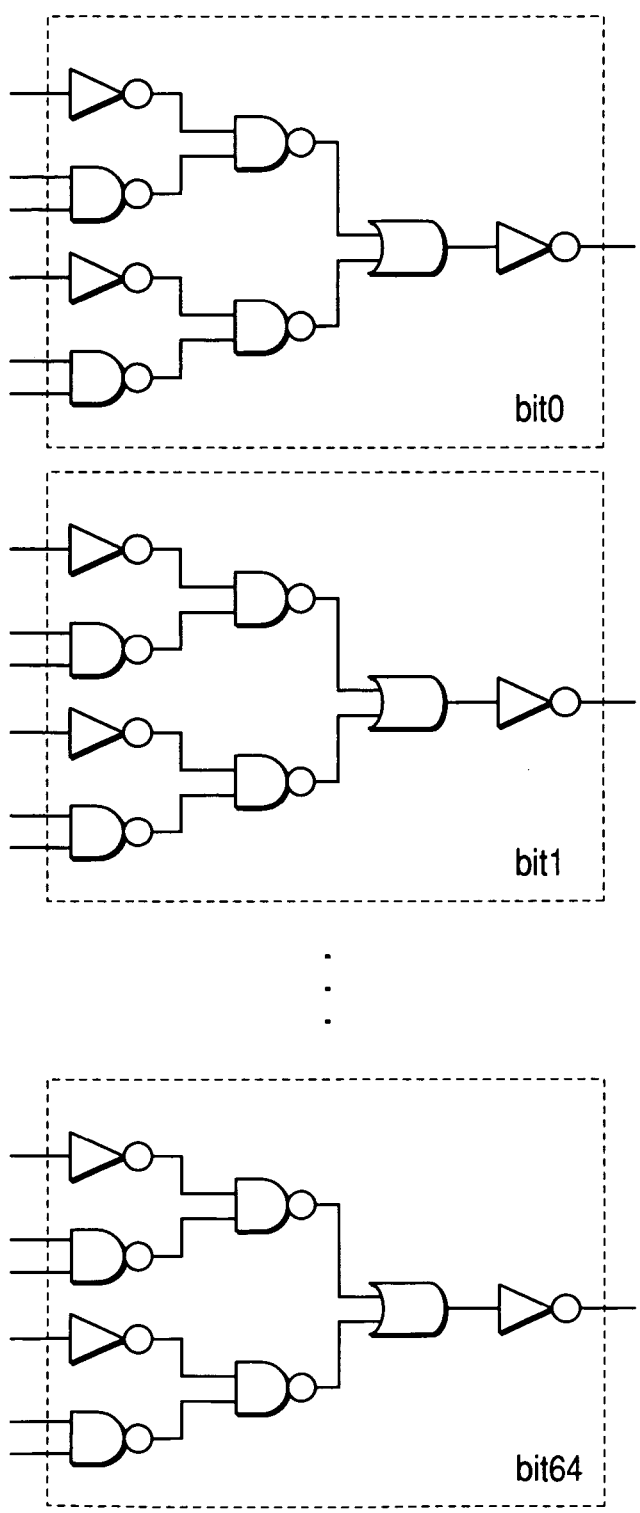
FIG. 7 is a circuit diagram showing an embodiment of a data path pertaining to FIG. 5.

FIG. 7 is a circuit diagram of a data path constituting the above digital logic circuit block in accordance with an embodiment. For the data path, Vth values require unification since the mutual computing speeds between bits 0 to 64 need to be made into the same value. For this reason, using ultra-low-Vth cells increases the usage rate of ultra-low-Vth MOSFETs, thus increasing their leakage currents. Therefore, in the case of the logic gate circuits or inverter circuits of the data path, the bits 0 to 64 can be output at almost the same timing by using standard-Vth or low-Vth cells to achieve speeding-up and leakage current reduction.

Figure 8:
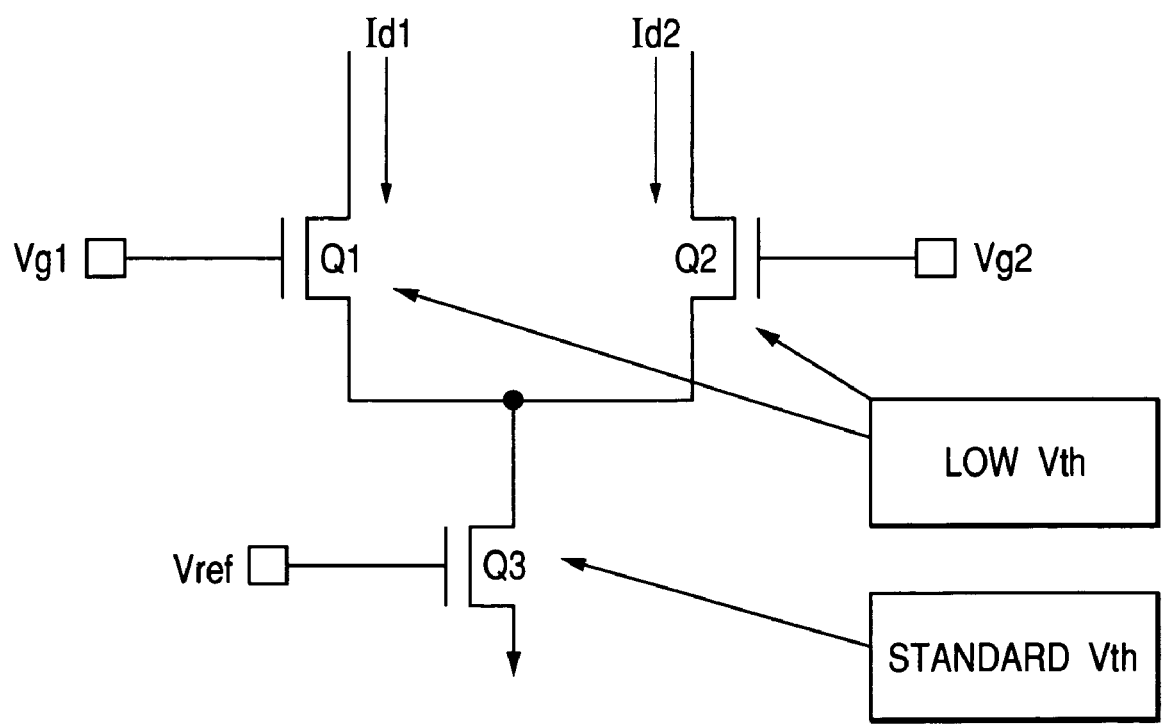
FIG. 8 is a circuit diagram showing an embodiment of the differential circuit used in an analog circuit pertaining to FIG. 5.

Analog circuits include low-Vth and standard-Vth cells. For example, in such a differential circuit as shown in FIG. 8, differential MOSFETs Q1 and Q2 each include a low-Vth cell, and a current source MOSFET Q3 that provides an operating current includes a standard-Vth cell. Using ultra-low-Vth or low-Vth MOSFETs as the current source MOSFETs of an analog circuit does not make current values constant because of channel length modulation. In this case, although using cascade connection is publicly known, the use of ultra-low-Vth or low-Vth MOSFETs in the current source increases power consumption. Standard-Vth MOSFETs are therefore used as the MOSFETs of the current source.

Figure 9:
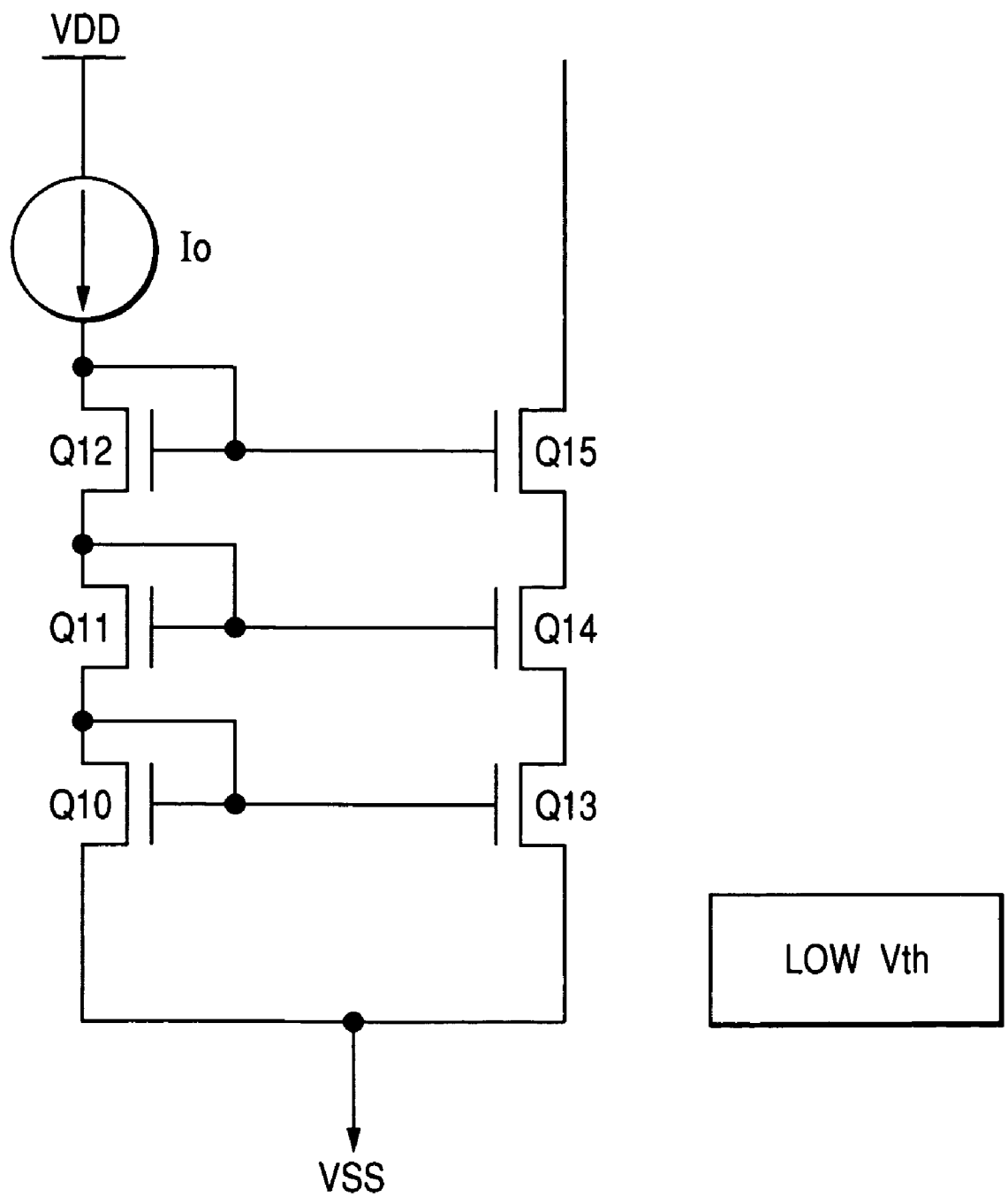
FIG. 9 is a circuit diagram showing an embodiment of the cascade-connected MOSFET circuit used in the analog circuit pertaining to FIG. 5.

When analog circuits are operated at low voltage, if Vth is too high, cascade-connected circuits are liable to become inoperative. Therefore, for such a cascade-connected MOSFET circuit as shown in FIG. 9, although it is necessary to use MOSFETs with low Vth, this also poses the problem that if Vth is too low, there occurs a decrease in gain. For this reason, low Vth is used for a cascade-connected circuit block. In this way, for analog circuits, standard Vth and low Vth are used to reduce leakage currents while at the same time achieving a certain degree of speeding-up. Also, for the digital/analog converter high-voltage section included in an analog circuit, standard-Vth cells and low-Vth I/O cells are used to minimize leakage currents while at the same time speeding up circuit operation.

Figure 10:
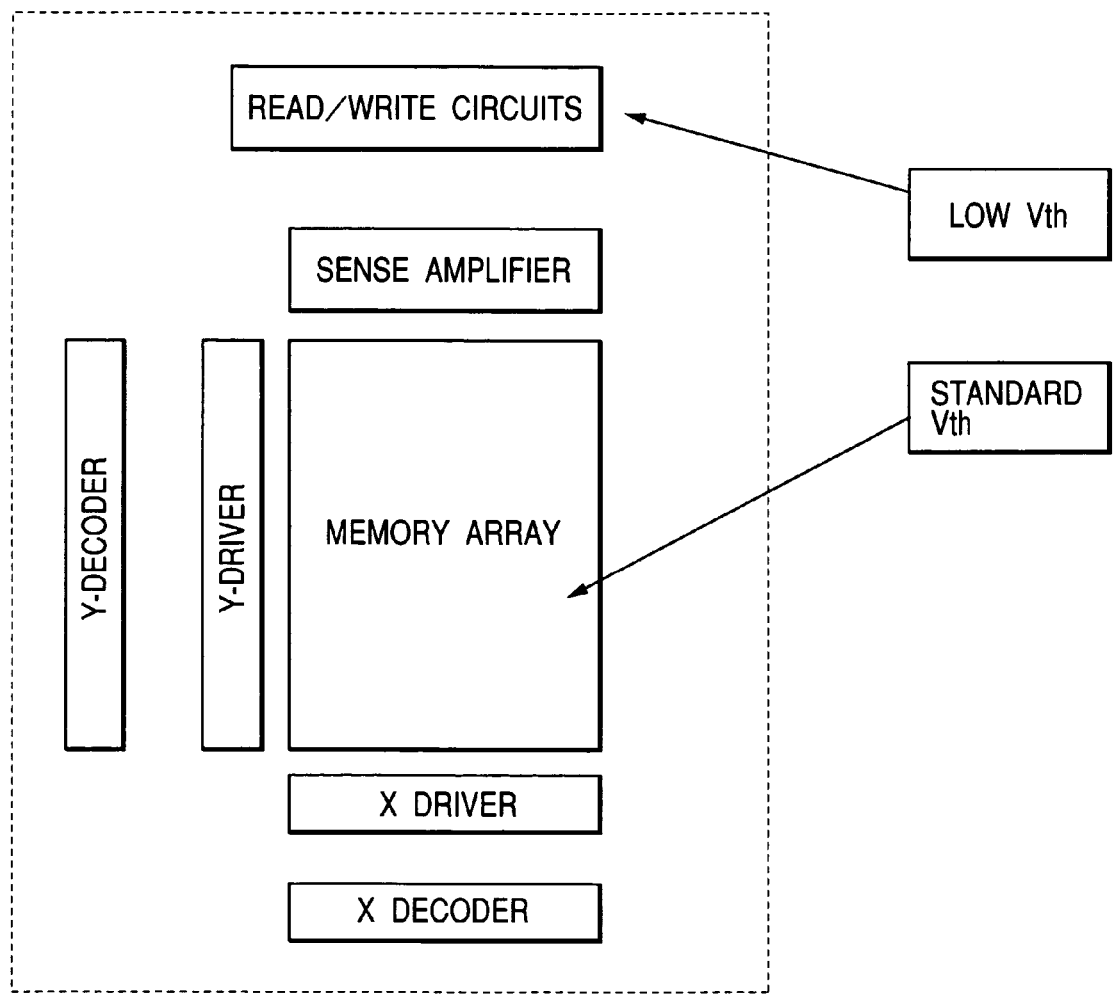
FIG. 10 is a block diagram showing an embodiment of a memory block pertaining to FIG. 5.

As shown in the block diagram of FIG. 10, a memory block is divided into a memory array and memory peripheral circuits that comprise an X-decoder, an X-driver, a Y-decoder, a Y-driver, a sense amplifier, and read/write circuits. The memory array includes standard-Vth MOSFETs, and the memory peripheral circuits include low-Vth MOSFETs. A production yield decreases if MOSFETs with low Vth (namely, ultra-low/low-Vth MOSFETs) are used in the memory array block.

Accordingly, the memory array block uses standard-Vth MOSFETs to minimize non-operating power consumption and to ensure sufficient operating margins and a higher yield. For memory peripheral circuits, more particularly for the address-decoding circuit and other memory peripheral circuits shown in FIG. 10, the respective Vth values need to be unified to prevent the occurrence of variations in speed per bit. For this reason, if ultra-low-Vth MOSFETs are used, leakage currents increase excessively since the usage ratio of the ultra-low-Vth sections increases excessively. Low-Vth MOSFETs are therefore used in the memory peripheral circuit section to implement a certain degree of speeding-up while at the same reducing leakage currents. Also, data read out from the memory is amplified by the sense amplifier, and the data, after being further amplified by a main amplifier not shown in the figure, is driven by the output drivers and then transferred to the required location.

Figure 14:
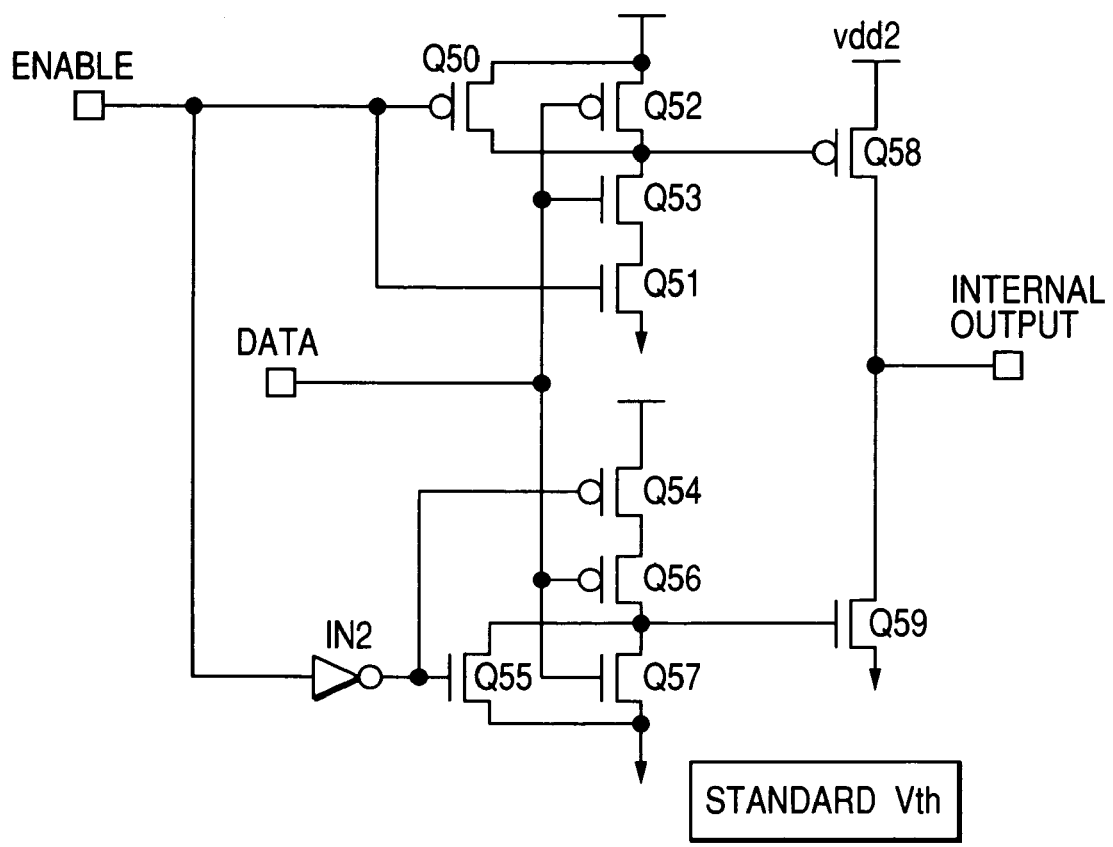
FIG. 14 is a circuit diagram showing an embodiment of the tri-state buffer included in the digital logic circuit pertaining to FIG. 5.

Here, the above main amplifier and the output drivers use such a tri-state buffer as shown in FIG. 14. Standard-Vth MOSFETs with high threshold voltage Vth are used to ensure operating margins for the buffer. Also, the threshold voltage Vth values of the MOSFETs require unification for minimized variations in speed per bit, and for this reason, the MOSFETs constituting the output drivers take the configuration having the same Vth in terms of bit units. In addition, since these drivers are large in size, if each is composed of low-Vth MOSFETs only, leakage currents increase excessively, and thus, standard-Vth MOSFETs are used.

For such a memory section, it takes a very long designing period if that circuit is closely designed taking the signal transferring speed and power consumption into consideration. In addition, in spite of memories also usually having their use diverted to other sections as a design asset, this is made impossible by such a designing task. Accordingly, closely designing with the signal transferring speed and power consumption being taken into consideration is usually not realistic. Therefore, it becomes possible, by unifying the threshold voltages Vth of the MOSFETs for each block such as the memory array or X-driver, to reduce the designing period and to facilitate diverted use as a design asset.

Figure 11:
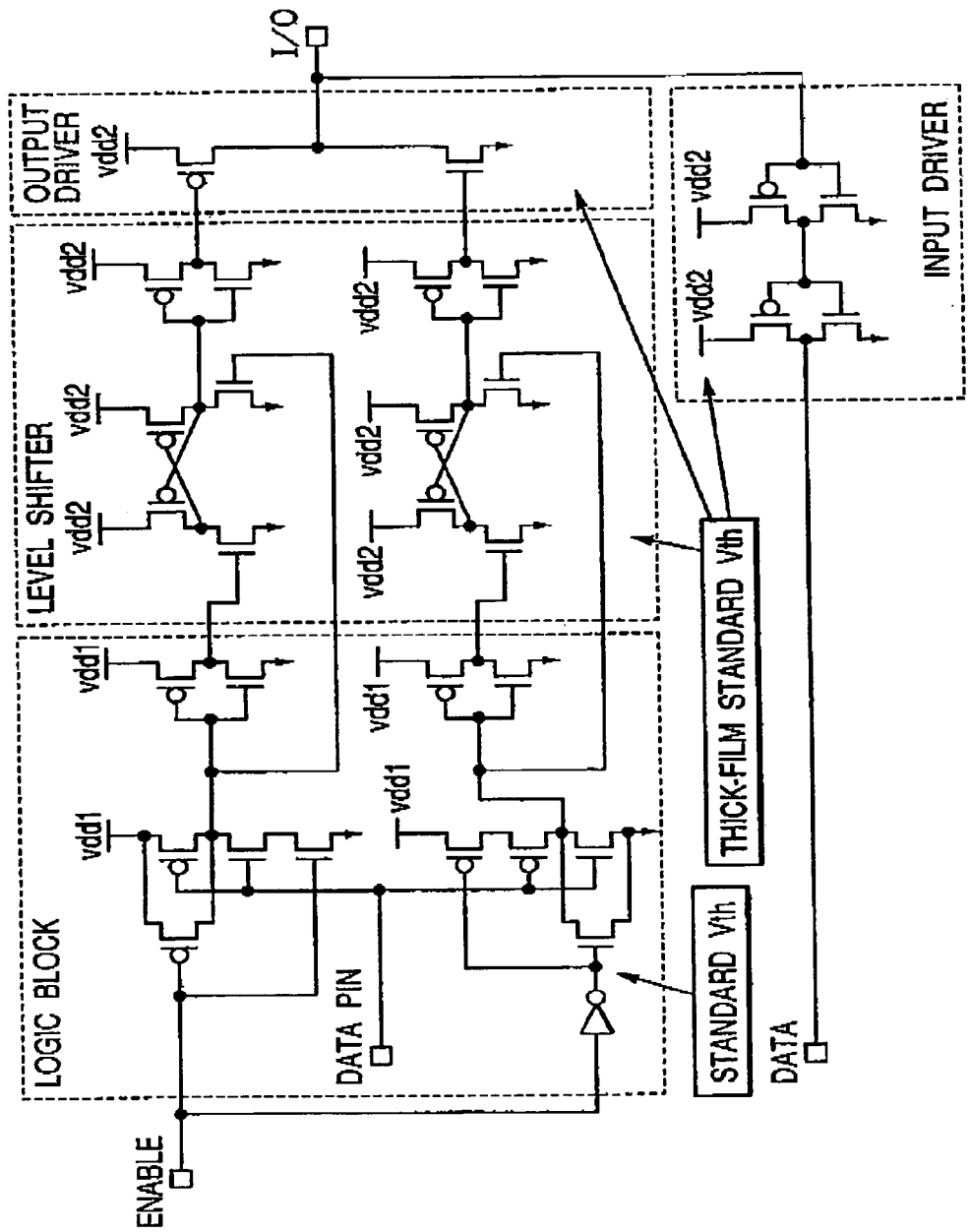
FIG. 11 is a circuit diagram showing an embodiment of a logic block, level shifter, output driver, and input driver intended for input/output circuits pertaining to FIG. 5.

FIG. 11 is a circuit diagram of a logic block, level shifter, output driver, and input driver intended for use in the input/output circuit in accordance with an embodiment. The use of MOSFETs with low Vth (namely, ultra-low-Vth/low-Vth MOSFETs) increases input/output leakage currents, and consequently, may result in spec violation. Also, since the speeds required of PCI, SDRAM, and other I/O sections are as low as 60 to 150 MHz, spec violation is less likely to result from using standard-Vth cells for the MOSFETs Q20 to Q25 in the above logic block, standard-Vth MOSFETs are used to reduce leakage currents. Similarly, high-voltage sections as described just below are also low in the speed required, and standard-Vth I/O cells are therefore used for these high-voltage sections to withstand high voltages. Examples of the high-voltage sections include MOSFETs Q26 to Q31 constituting the level shifter by which the signal corresponding to the operating voltage of the above digital logic circuit, for example, a signal Vdd1 having a small amplitude of about 1.8 V, is converted into the signal corresponding to the operating voltage of the output circuit, for example, a signal Vdd2 having a large amplitude of about 3.0 V; MOSFETs Q32 and Q33 constituting the output drivers; and MOSFETs Q34 to Q37 constituting the input drivers.

Figure 12:
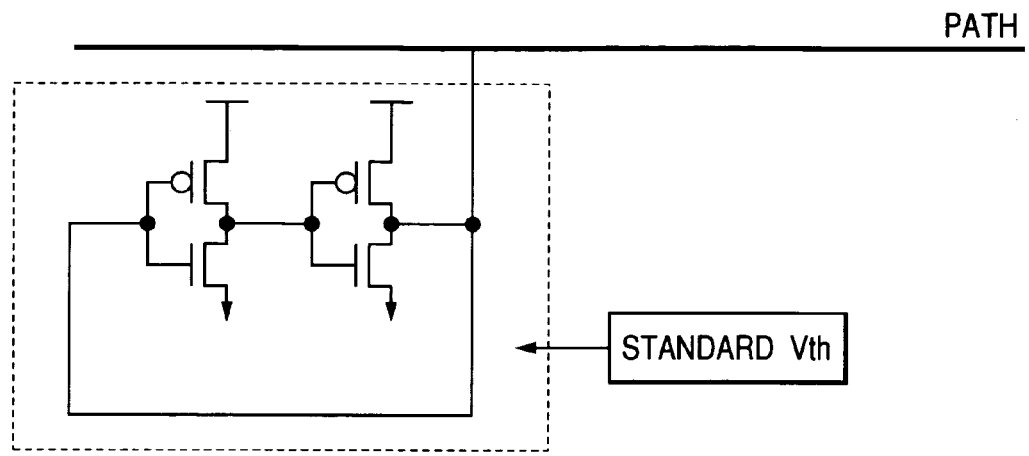
FIG. 12 is a circuit diagram showing an embodiment of the bus keeper included in the data path and digital logic circuit pertaining to FIG. 5.

FIG. 12 is a circuit diagram of a bus keeper included in the data path or the digital logic circuit in accordance with an embodiment. The bus keeper comprises a latching circuit and prevents the bus from taking an undefined level when the bus is not connected to any circuit. Accordingly, since the bus keeper does not require a great driving capability, the keeper is composed of MOSFETs with high Vth.

Figure 13:
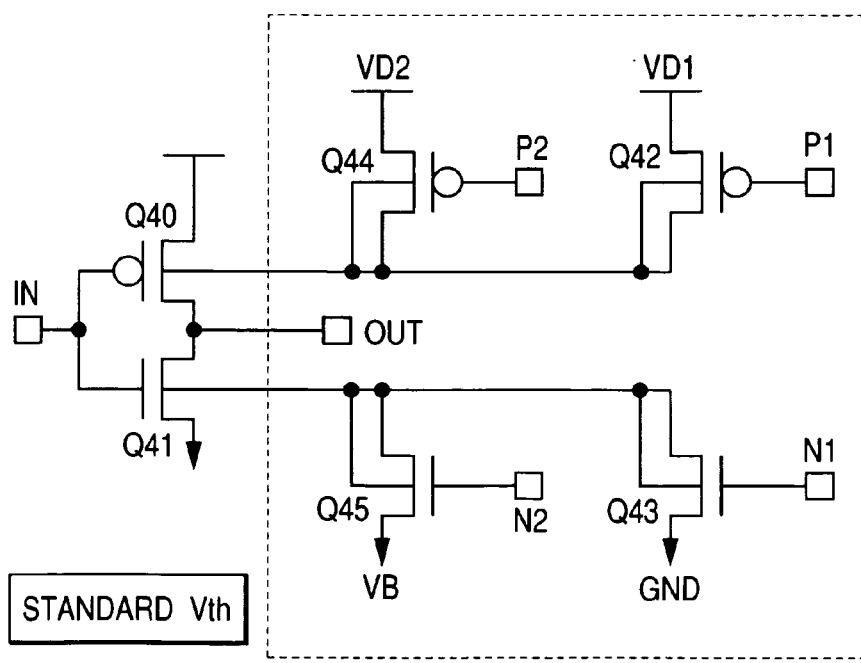
FIG. 13 is a circuit diagram showing an embodiment of the back bias switch provided in the semiconductor integrated-circuit device of FIG. 5.

FIG. 13 is a circuit diagram of a back-bias switch according to an embodiment. In this embodiment, ultra-low-Vth/low-Vth MOSFETs are used at Q40 and Q41, as described above. In these circuits, even under the standby state in which no circuits operate, in other words, under the state in which an input signal IN is fixed at a low level or a high level, a DC current flows between the source voltage and the grounding potential of the circuit through the MOSFETs Q40 and Q41 constituting the CMOS circuit.

Accordingly, a switch composed of MOSFETs Q42 and Q43, and a back-bias switch composed of MOSFETs Q44 and Q45 are provided for the well regions in which the MOSFETs Q40 and Q41 in the logic circuit block are formed. That is, during operation, the MOSFETs Q42 and Q43 are turned on, and a voltage VD1 is supplied to the well region in which the P-channel MOSFET Q40 is formed, and a grounding potential GND of the circuit is supplied to the well region in which the N-channel MOSFET Q41 is formed. The above voltage VD1 is the same as the operating voltage applied to the source electrode of the P-channel MOSFET Q40 in the inverter circuit.

Under the standby state in which the above logic circuit does not operate at all, the MOSFETs Q42 and Q43 are turned off, and a voltage VD2 is supplied to the well region in which the P-channel MOSFET Q40 is formed, and a negative voltage VB of the circuit is supplied to the well region in which the N-channel MOSFET Q41 is formed. Since the above-mentioned VD1 and VD2 are maintained in the relationship of VD2>VD1, a back-bias relationship is established between the source electrode of the P-channel MOSFET Q40 and the well region and likewise, a back-bias relationship is established between the source electrode of the N-channel MOSFET Q41 and the well region. Consequently, the effective threshold voltages of these MOSFET Q40 and MOSFET Q42 are increased by a substrate effect, thereby allowing the above DC current to be reduced significantly.

FIG. 14 is a circuit diagram of the tri-state buffer included in the digital logic circuit in accordance with an embodiment. This tri-state buffer is used as a circuit that supplies output signals to, for example, such bus as shown in FIG. 12. It is necessary to provide operating margins for such a tri-state buffer. Since using ultra-low-Vth or low-Vth cells is likely to result in malfunction due to increases in leakage current, operating margins are provided using standard-Vth cells.

Figure 15A:
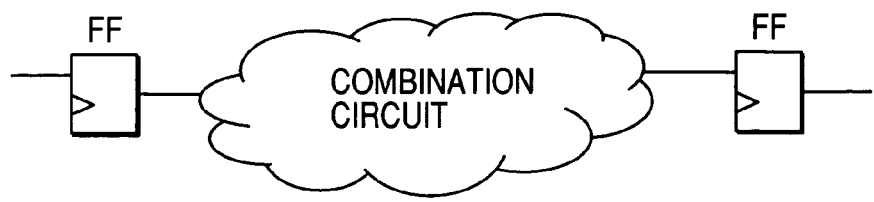
FIGS. 15A and 15B are configuration diagrams showing embodiments of paths which are designed using the method of FIG. 1.
Figure 15B:
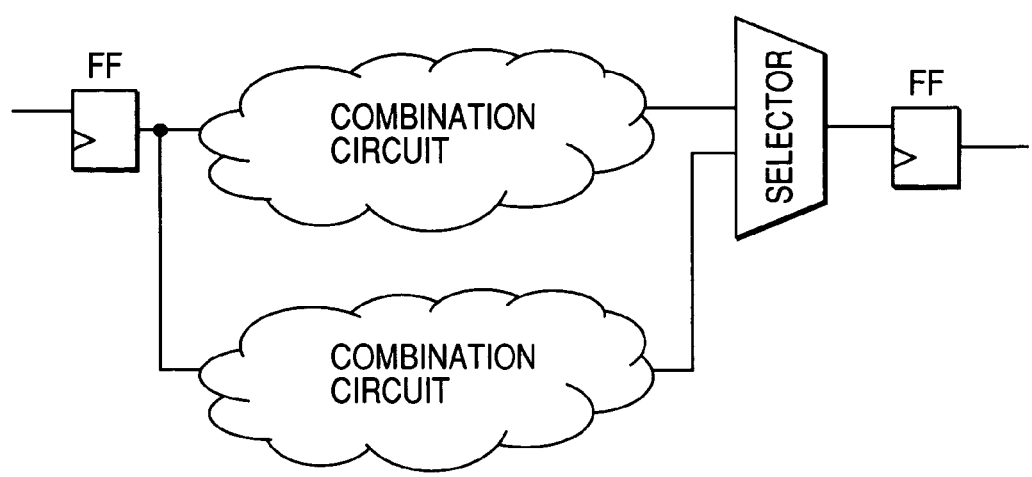

FIGS. 15A and 15B illustrate embodiments of paths designed using the method of FIG. 1. FIG. 15A shows a combination circuit between flip-flops (FFs), and one signal-transferring path interposed between the flip-flops. In the present invention, high-speed operation of this combination circuit is made possible by constituting it only with one or more depletion-type MOSFETs among the plurality of MOSFETs included in the circuit. Also, designing this circuit using the method shown in FIG. 1 makes it possible to prevent power consumption from increasing.

Referring to FIG. 15B, combination circuits are connected in parallel with each other from one FF, and outputs from these circuits are received at a selector and then an output therefrom is further received at another FF. This circuit configuration is an example in which the selector receives the outputs from the above-mentioned parallel-connected combination circuits and then transfers these outputs to the FF located at the succeeding stage, and the present invention is not specifically limited thereto insofar as the combination circuits are such that the selector operates so as to perform the necessary function by receiving a plurality of signal outputs. In other words, the configuration shown in FIG. 15B can have a plurality of signal transferring paths between the FFs.

As a result of the design using the method of FIG. 2, part or all of the combination circuits in FIG. 15B may be composed of depletion-type MOSFETs, or part, such as the selector, or all of the combination circuits may be composed of depletion-type MOSFETs. More specifically, in FIG. 15B, although two signal transferring paths are shown, if the number of logic gates included in one signal transferring path is greater than that of logic gates included in the other signal transferring path, it is also possible to use depletion-type MOSFETs only for part of the signal voltage path in which a number of logic gates are included, and use only enhancement-type MOSFETs for the other signal voltage path. In addition, depletion-type MOSFETs can be used for both signal transferring paths, in which case, the number of depletion-type MOSFETs used may differ between both the signal transferring paths. Of course, MOSFETs with high threshold voltage and those with low threshold voltage may exist as the enhancement-type MOSFETs in these combination circuits. The use of these path configurations makes it possible to achieve faster chip operation and less power consumption by speeding up the operation of critical paths while at the same time minimizing leakage currents.

Figure 16:
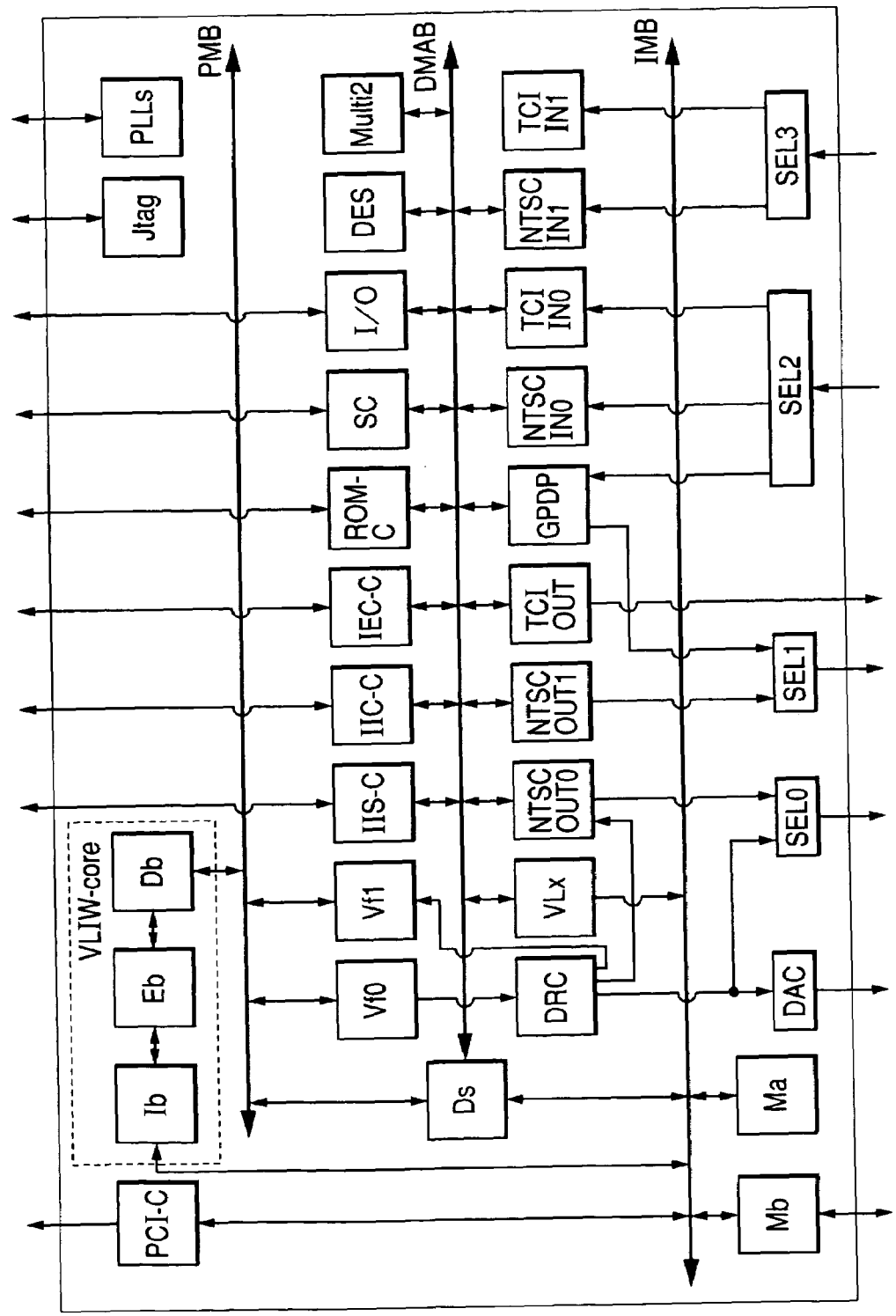
FIG. 16 is a functional block diagram showing an embodiment of a semiconductor integrated-circuit device to which the present invention is applied.

FIG. 16 is a functional block diagram of a semiconductor chip designed using the method of FIG. 2 in accordance with an embodiment. This chip is used as a processor for image processing. Each of the circuit elements in FIG. 16 corresponds to those of FIG. 5, and PLLs and DAC, VLIW-core, and other units constitute an analog circuit, a data path, and a digital logic circuit, respectively.

PLC-C is a PCI control unit that controls data exchange with a PCI path. The VLIW-core is a core CPU that uses a programmed control scheme to execute required arithmetic processing and control the entire functional block. The Ib section in the VLIW-core is an instruction control unit having an instruction cache and controlling instructions, Db is a data control unit having a data cache and controlling data, and Eb executes arithmetic processing based on the instruction commands stored within the instruction cache of Ib. Jtag is a circuit for a Jtag interface, and the PLLs section constitutes one or more circuit blocks for supplying a progressively multiplied reference clock to the entire functional block. Vf0 and Vf1 are circuits that provide image data scaling (enlarging/reducing).

IIS-C is a control unit for an interface based on JIS standards. IIC-C is a control unit circuit for an interface based on IIC standards. IEC-C is a control unit circuit for an interface based on IEC Standard 958. ROM-C is a control unit circuit for an external ROM flash interface. SC is a control unit circuit for a serial interface. General-purpose I/O is a general-purpose input/output unit circuit. DES and Multi2 are encryption circuits. TCIIN1 and TCIIN0 are input control circuits for interfacing with data based on TCI (Transport Channel Interface) standards.

NTSCIN1 and NTSCIN0 are input control circuits for interfacing with data based on ITU Standard 656. GPDP is a general-purpose communications unit circuit. TCIOUT is an output control circuit for interfacing with data based on TCI (Transport Channel Interface) standards. NTSCOUT1 and NTSCOUT0 are output control circuits for interfacing with data based on ITU Standard 656. VLx is a variable-length code-processing circuit. DRC is a circuit for data display on an external display device.

Ds is a circuit for controlling data transfer within the chip, and it is one type of DMAC (Direct Memory Access Controller) for transferring data to the required location automatically and continuously. Mb is a control circuit for a memory interface, and Ma is a circuit for performing motion-compensating and motion-detecting processes during decoding and encoding. DAC is a digital-analog converter. There also exist memories other than the Ib and Db described above. A memory is present in Vf0, Vf1, DES, Multi2, VLx, Ds, Mb, and Ma each. Each of these circuits has a coprocessor for providing arithmetic control in order to perform the above-mentioned functions, and each memory exists as a cache for the coprocessor. These memories correspond to FIGS. 5 and 10, wherein the memory array, the main amplifier, and the output drivers are designed with standard-Vth MOSFETs and the peripheral circuits of each memory are designed with low-Vth MOSFETs.

Figure 17:
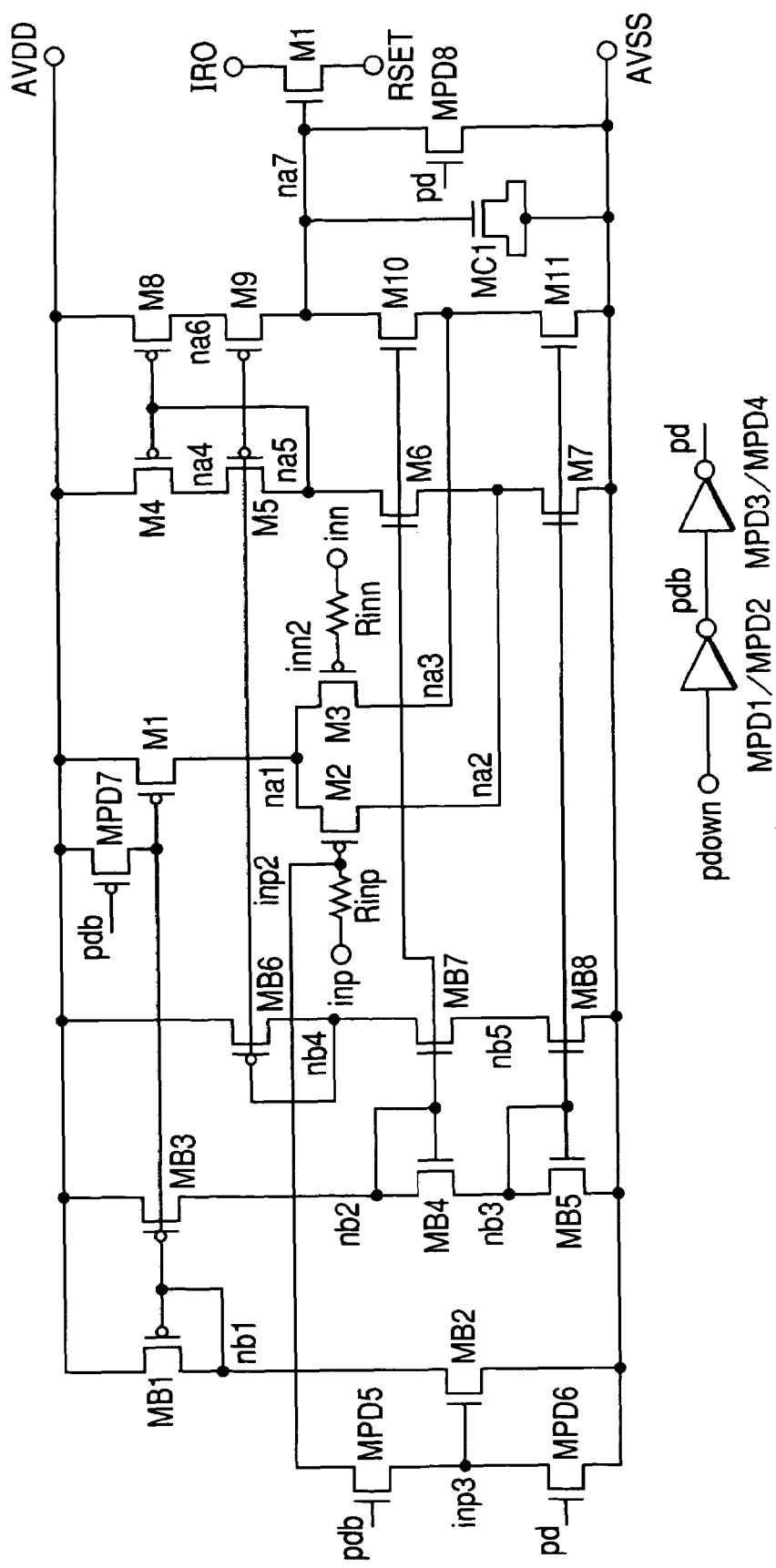
FIG. 17 is a circuit diagram showing part of a DAC pertaining to FIG. 16, according to an embodiment.

FIG. 17 shows part of the DAC in above-mentioned FIG. 16. The circuits in FIG. 17 are circuits by which the data obtained by digital-to-analog conversion of the digital display data sent from the DRC is amplified when necessary. In this circuit configuration, "inp" and "inn" are complementary voltages, and analog-converted data is input to these circuit blocks and amplified data is output from IRO and then output as image display data. At this time, the data that has been output from the IRO can also undergo processing, such as waveform shaping, before being output as image display data.

M1 is a constant-current source, M2, M3, M7, M11 are differential amplifiers, and the M2 and the M3 constitute a differential amplification circuit. MB1, MB3, and M1 are current mirrors with respect to a potential of nb1, MB4, MB7, M6, and M10 are current mirrors with respect to a potential of nb2, MB5, MB8, M7, and M11 are current mirrors with respect to a potential of nb3, MB6, M5, and M9 are current mirrors with respect to a potential of nb4, and M4 and M8 are current mirrors with respect to a potential of nb5. The MB3, the MB4, the MB7, MB5, and the MB8 form such a cascade-connected circuit as in FIG. 9.

Since these current mirrors have their MOSFETs multistage-stacked at the potential between ADSS and AVSS, if the ADSS-AVSS potential is too low, using MOSFETs with high Vth makes the MOSFETs inoperative. Conversely, using MOSFETs with too low Vth results in a too small gain. For these reasons, low-Vth MOSFETs are used. At the differential amplifiers, the Vth of the MOSFETs as shown in FIG. 8 is obtained and the effects as set forth in the description of FIG. 8 can be achieved. It is possible, by designing circuits in this way, to obtain circuits capable of obtaining a moderate gain while at the same time achieving a certain degree of speeding-up.

Figure 18:
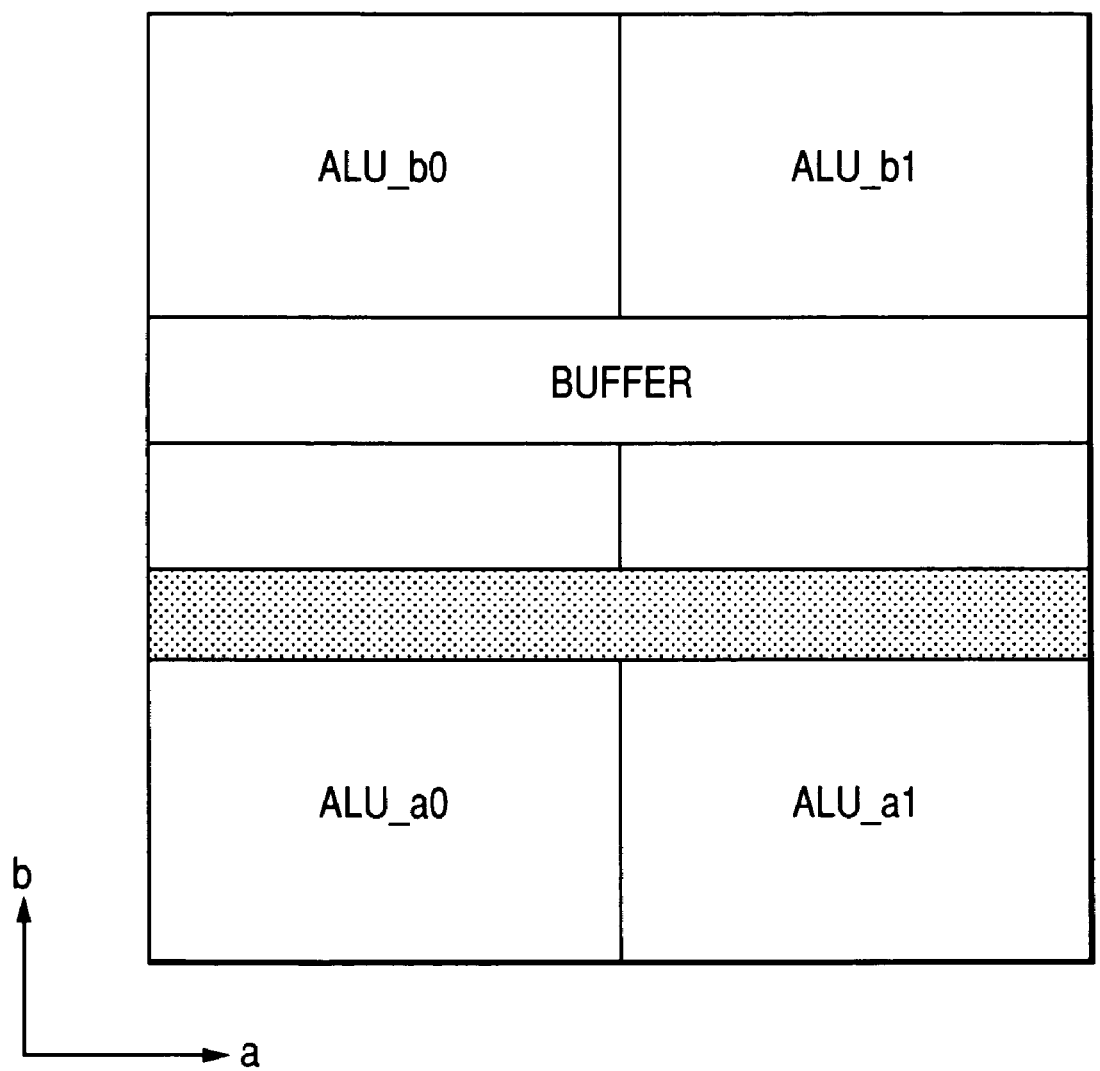
FIG. 18 is a block diagram showing an embodiment of the data path pertaining to FIG. 5.

FIG. 18 shows an example of data path structure, wherein bits are arranged in a bit-slice manner in the direction of "a" and computations are performed in the direction of "b". Since, as set forth in the description of FIG. 7, computing speeds need to be made into the same value, circuit elements that is designed by replacement using the method of FIG. 1 are designed so that all Vth values are the same in the direction of "a". For example, a buffer and the like are replaced with low-Vth cells for each bit slice. Also, since the use of ultra-low Vth increases the rate of ultra-low-Vth MOSFETs excessively, the data path is formed using low-Vth and standard-Vth MOSFETs.

Incidentally, FIG. 1 is the flowchart and FIG. 2 is the conceptual diagram of the circuits corresponding to the flowchart, wherein the flip-flops in FIG. 2 are not replaced with low-Vth or ultra-low-Vth MOSFETs. It is however possible to achieve further speeding-up by replacing the flip-flops and to easily set the hold time and setup time for the flip-flops by, as in the embodiment, leaving the standard-Vth MOSFETs as they are.

Although the invention that was made by the present applicant has been heretofore described in detail on the basis of embodiments, the present invention is not limited by these embodiments, and needless to say, a variety of changes may be made without departing from the scope of the invention. For example, the digital integrated circuits may be composed of random logic circuits, other gate arrays, or the like. The substrate bias voltage may be formed inside the semiconductor integrated-circuit device via a charge pump circuit or may be a voltage supplied from external terminals. The present invention can be widely used for semiconductor integrated-circuit devices composed of CMOS circuits, and for a method of speeding up the operation of these circuits.

A signal transferring path includes a plurality of CMOS-constructed logic gate circuits provided between one pair of flip-flop circuits for acquiring and holding signals by use of clock signals. The signal transferring path includes a first and a second signal transferring path. The first signal transferring path is constituted by enhancement-type MOSFETs and has a signal transferring delay time equal to, or less than, a permissible signal transferring delay time. The second signal transferring path is configured such that, among the above-mentioned plurality of logic gate circuits, a logic gate circuit having a delay time longer than the above-mentioned permissible signal transferring delay time when constituted using enhancement-type MOSFETs is replaced with a depletion-type MOSFET so that the second signal transferring path may provide a signal transferring delay time equal to or less than the permissible signal transferring delay time mentioned above. Thus, both higher-density circuit integration and operational speeding-up can be achieved.

A designing step is repeated so that the signal transferring delay time of all the signal transferring paths may stay within a permissible signal transferring delay time range. The designing step includes: designing a signal-processing circuit using enhancement type MOSFETs, the signal-processing circuit comprising a plurality of flip-flop circuits for acquiring and holding signals by use of clock signals, and a plurality of CMOS-constructed logic gate circuits provided between one pair of flip-flop circuits within the plurality of flip-flop circuits; extracting, from the plurality of signal transferring paths, a signal transferring path whose signal transferring delay time that exceeds a permissible signal transferring delay time; and replacing, among the plurality of logic gate circuits constituting the signal transferring path that has extracted, a logic gate circuit having a delay time longer than the permissible signal transferring delay time when the logic gate circuit is constituted by an enhancement-type MOSFET with a depletion-type MOSFET so that the signal transferring path may provide a signal transferring delay time equal to or less than the permissible signal transferring delay time. Thus, CMOS circuit speeding-up can be accomplished.

The application of the present invention allows higher-density integration of semiconductor integrated circuits and the speeding-up of their operation to be implemented by using depletion-type MOSFETs in respective digital logic circuits.

Reference symbols are as follows:
(1) to (8) . . . Design steps, FF1, FF2 . . . Flip-flop circuits, a to f . . . Input signals, x . . . Output signal, Q1 to Q59 . . . MOSFETs.

What is claimed is:

1. The semiconductor integrated-circuit device, comprising:
   a plurality of flip-flop circuits for acquiring and holding signals by use of clock signals; and
   a plurality of signal transferring paths each including a plurality of CMOS-constructed logic gate circuits provided between one pair of flip-flop circuits within said plurality of flip-flop circuits;
   said plurality of signal transferring paths further including:
   a first signal transferring path in which said plurality of logic gate circuits are constituted by enhancement-type MOSFETs, said first signal transferring path providing a signal transferring delay time equal to, or less than, a permissible signal transferring delay time;
   a second signal transferring path in which, among all said plurality of logic gate circuits, a logic gate circuit having a delay time longer than said permissible signal transferring delay time when the logic gate circuit is constituted by an enhancement-type MOSFET is replaced with a depletion-type MOSFET so that the second signal transferring path may provide a signal transferring delay time equal to, or less than, said permissible signal transferring delay time; and
   wherein the depletion-type MOSFET constituting the logic gate circuit to be replaced is formed by applying a manufacturing step for depletion to a MOSFET having the same pattern and size as those of the enhancement-type MOSFET that has not been replaced.

2. The semiconductor integrated-circuit device, comprising:
   a plurality of flip-flop circuits for acquiring and holding signals by use of clock signals; and
   a plurality of signal transferring paths each including a plurality of CMOS-constructed logic gate circuits provided between one pair of flip-flop circuits within said plurality of flip-flop circuits;
   said plurality of signal transferring paths further including:
   a first signal transferring path in which said plurality of logic gate circuits are constituted by enhancement-type MOSFETs, said first signal transferring path providing a signal transferring delay time equal to, or less than, a permissible signal transferring delay time;
   a second signal transferring path in which, among all said plurality of logic gate circuits, a logic gate circuit having a delay time longer than said permissible signal transferring delay time when the logic gate circuit is constituted by an enhancement-type MOSFET is replaced with a depletion-type MOSFET so that the second signal transferring path may provide a signal transferring delay time equal to, or less than, said permissible signal transferring delay time; and
   enhancement-type MOSFETs with high threshold voltage, enhancement-type MOSFETs with low threshold voltage, and depletion-type MOSFETs;

wherein said flip-flop circuits and said first signal transferring path are constituted by said enhancement-type MOSFETs with high threshold voltage; and wherein said second signal transferring path is constituted by said enhancement-type MOSFETs with high threshold voltage and said enhancement-type MOSFETs with low threshold voltage, by said enhancement-type MOSFETs with low threshold voltage, by said enhancement-type MOSFETs with low threshold voltage and said depletion-type MOSFETs, or by said depletion-type MOSFETs.

3. The semiconductor integrated-circuit device according to claim 2, further comprising MOSFETs with high withstand voltage and high threshold voltage, wherein input/output circuits for exchanging signals with external terminals are constituted by said MOSFETS with high withstand voltage and high threshold voltage, and said MOSFETs with high threshold voltage.

4. The semiconductor integrated-circuit device according to claim 2, further comprising a memory circuit, wherein a memory array in said memory circuit is constituted by said enhancement-type MOSFETs with high threshold voltage, and a peripheral circuit of this memory array is constituted by said enhancement-type MOSFETs with low threshold voltage.

5. The semiconductor integrated-circuit device according to claim 2, further comprising analog circuits, wherein, among all said analog circuits, a MOSFET circuit constituting a current source is formed using said enhancement-type MOSFETs with high threshold voltage, and a differential MOSFET circuit and a cascade-connected circuit are formed using said enhancement-type MOSFETs with high threshold voltage.

6. The semiconductor integrated-circuit device according to claim 1, wherein, in a standby state in which no signal processing is performed through a signal transferring path, said deletion-type MOSFETs have substrate bias voltage applied in a direction of decreasing a source-to-drain current decreases.

7. The CMOS circuit operational speeding-up method, comprising:
a first step of designing a signal-processing circuit using enhancement type MOSFETs, said signal-processing circuit comprising a plurality of flip-flop circuits for acquiring and holding signals by use of clock signals, and a plurality of CMOS-constructed logic gate circuits provided between one pair of flip-flop circuits within said plurality of flip-flop circuits;
a second step of extracting, from said plurality of signal transferring paths, a signal transferring path whose signal transferring delay time that exceeds a permissible signal transferring delay time;
a third step of replacing, among said plurality of logic gate circuits constituting said signal transferring path that has extracted, a logic gate circuit having a delay time longer than said permissible signal transferring delay time when the logic gate circuit is constituted by an enhancement-type MOSFET with a depletion-type MOSFET so that said signal transferring path may provide a signal transferring delay time equal to or less than said permissible signal transferring delay time; and
wherein said third step is followed by said second step after, of all said enhancement-type MOSFETs constituting said signal transferring paths, a MOSFET having a maximum delay time has been replaced with the depletion-type MOSFET.

8. The CMOS circuit operational speeding-up method according to claim 7, wherein, if said signal transferring path to be extracted is absent, all the delay times of said plurality of signal transferring paths are judged to be equal to or less than said permissible signal transferring delay time.

9. The CMOS circuit operational speeding-up method according to claim 8, wherein, when, in said third step, all MOSFETs of said signal transferring paths are said depletion-type MOSFETs and the signal transferring delay time thereof is taken as a first time, processing returns to said first step and said permissible signal transferring delay time is set as said first time.

10. The CMOS circuit operational speeding-up method according to claim 7, in which, in said third step, among said plurality of logic gate circuits constituting said signal transferring path that has extracted, a logic gate circuit having a delay time longer than said permissible signal transferring delay time when the logic gate circuit is constituted by an enhancement-type MOSFET is replaced with second enhancement-type MOSFETs smaller then said enhancement-type MOSFETs in terms of threshold voltage so that said signal transferring path extracted may provide a signal transferring delay time equal to, or less than, said permissible signal transferring delay time.

11. The CMOS circuit operational speeding-up method according to claim 7, wherein the signal-processing circuit in said first step is one mounted on an existing semiconductor integrated-circuit device.

12. A semiconductor integrated-circuit device, wherein:
a signal input block of a first combination circuit and that of a second combination circuit are connected across an output of a first flip-flop;
a signal input block of a third combination circuit is connected to the signal input blocks of said first and second combination circuits;
an input of a second flip-flop is connected to the signal output block of said third combination circuit;
said first, second, and third combination circuits are constituted by one or more logic gates; and
part of said logic gates is constituted by a depletion-type MOSFET,
wherein the logic gates in said semiconductor integrated circuits are further formed with first MOSFETs of the enhancement type whose threshold voltage is a first threshold voltage, and second MOSFETs of the enhancement type whose threshold voltage is a second threshold voltage, said first threshold voltage being higher than said second threshold voltage.

13. The semiconductor integrated-circuit device comprising: one or more logic gates between an output of a first flip-flop and an input of a second flip-flop;
wherein part of said plurality of logic gates is constituted by a depletion-type MOSFET; and
wherein the logic gates in said semiconductor integrated circuits are further formed with first MOSFETs of the enhancement type whose threshold voltage is a first threshold voltage, and second MOSFETs of the enhancement type whose threshold voltage is a second threshold voltage, said first threshold voltage being higher than said second threshold voltage; and
further comprising input/output circuits for exchanging signals with external terminals, wherein said input/output circuits are constituted by a plurality of MOSFETs having said first threshold voltage, and said plurality of MOSFETs are MOSFETs different in withstand voltage.

14. The semiconductor integrated-circuit device according to claim 13, further comprising a memory circuit, wherein a memory array of said memory circuit is constituted by enhancement-type MOSFETs of said first threshold voltage, and a peripheral circuit of said memory circuit are constituted by an enhancement-type MOSFET of said second threshold voltage.

15. The semiconductor integrated-circuit device according to claim 13, further comprising analog circuits, wherein among said analog circuits, a MOSFET circuit constituting a current source is formed using enhancement-type MOSFETs of said first threshold voltage, and a differential MOSFET circuit and a cascade-connected circuit are formed using said enhancement-type MOSFETs of said second threshold voltage.

16. The semiconductor integrated-circuit device according to claim 13, wherein, in a standby state in which no signal processing is performed through a signal transferring path, said deletion-type MOSFETs have substrate bias voltage applied in a direction of decreasing a source-to-drain current decreases.

* * * * *